(12) United States Patent
Dehe et al.

(10) Patent No.: US 9,061,896 B2
(45) Date of Patent: Jun. 23, 2015

(54) METHOD FOR MANUFACTURING A MEMS DEVICE AND MEMS DEVICE

(71) Applicant: Infineon Technologies AG, Neubiberg (DE)

(72) Inventors: Alfons Dehe, Reutlingen (DE); Christoph Glacer, Munich (DE); Soenke Pirk, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/010,360

(22) Filed: Aug. 26, 2013

(65) Prior Publication Data

US 2015/0054097 A1 Feb. 26, 2015

(51) Int. Cl.
*B81C 1/00* (2006.01)
*B81B 7/00* (2006.01)

(52) U.S. Cl.
CPC ........... *B81C 1/00539* (2013.01); *B81B 7/0009* (2013.01)

(58) Field of Classification Search
CPC .................... B81C 1/00539; B81B 7/0009
See application file for complete search history.

(56) References Cited

U.S. PATENT DOCUMENTS

| 4,726,845 | A | * | 2/1988 | Thompson et al. | ........ | 106/31.68 |
| 8,208,671 | B2 | | 6/2012 | Chen et al. | | |

* cited by examiner

*Primary Examiner* — Roy Potter
*Assistant Examiner* — Paul Patton
(74) *Attorney, Agent, or Firm* — Slater & Matsil, L.L.P.

(57) ABSTRACT

A method for manufacturing a MEMS device includes providing a cavity within a layer adjacent to a sacrificial layer. The cavity extends to the sacrificial layer and includes a capillary slot protruding into the layer. The sacrificial layer is removed by exposing the sacrificial layer to an etching agent that is introduced through the cavity.

21 Claims, 4 Drawing Sheets

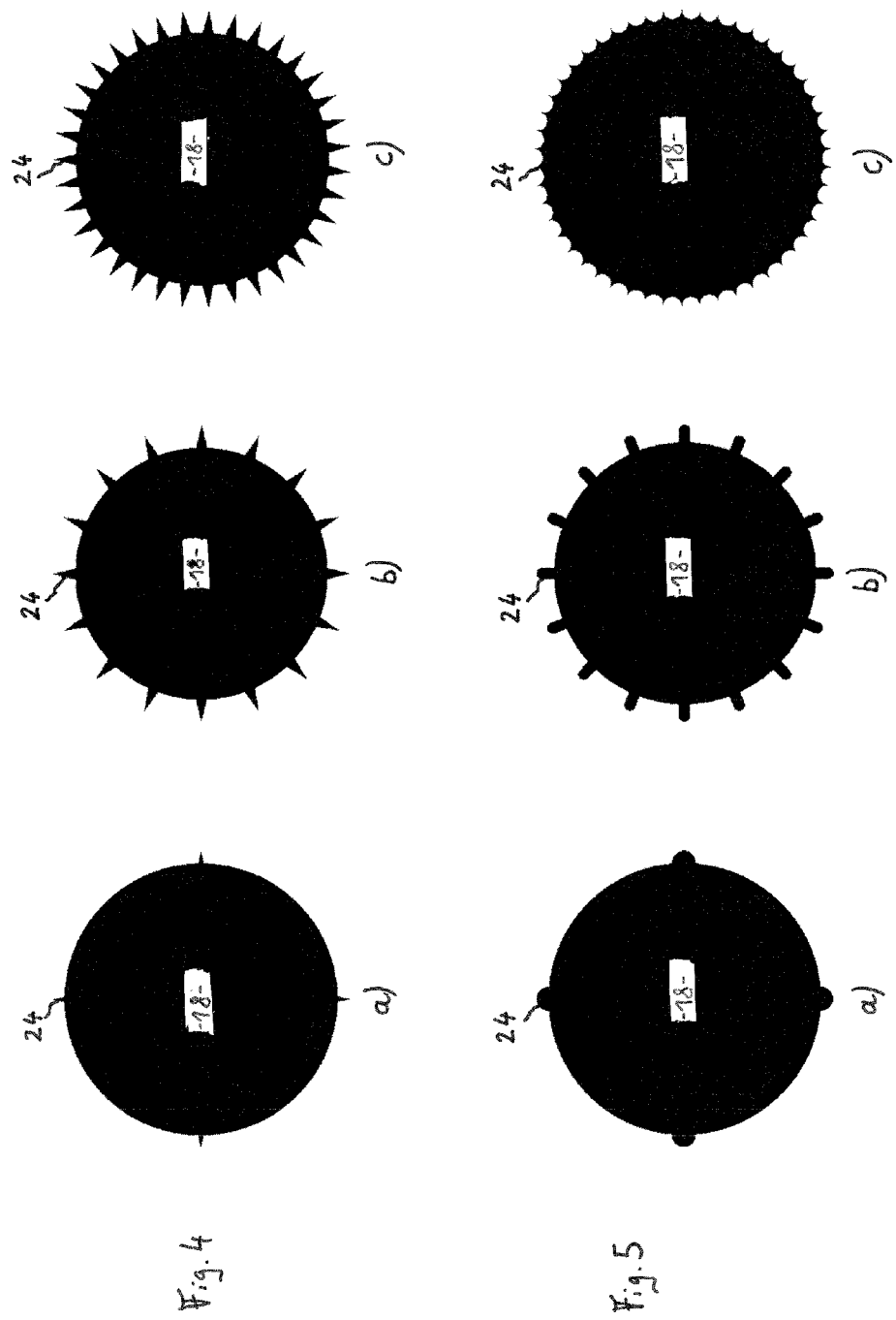

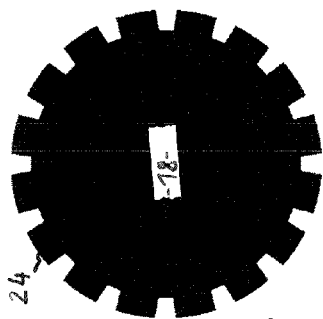
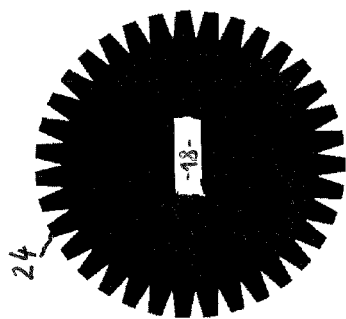
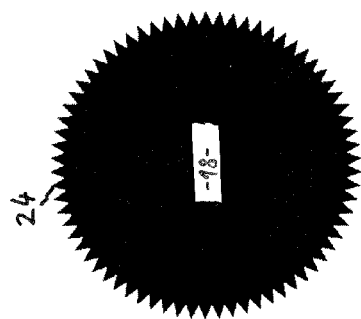
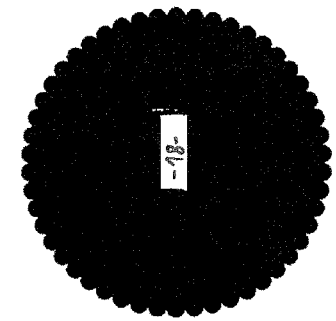
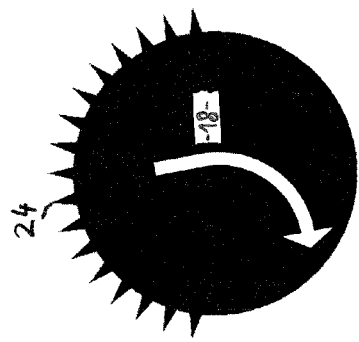

METHOD FOR MANUFACTURING A MEMS DEVICE AND MEMS DEVICE

TECHNICAL FIELD

Embodiments of the invention refer to a method for manufacturing a MEMS device and to a MEMS device.

BACKGROUND

During manufacturing of a MEMS device, such as pressure sensors, acceleration sensors, microphones or loudspeakers, deep cavities may be formed. The deep cavities can be bulk micro-machined. One example of a deep cavity is a back cavity of some designs of a MEMS microphone. Moreover, in some manufacturing processes relative to MEMS devices, a sacrificial layer may have to be removed by sacrificial layer etching. Sacrificial layer etching may require that an etching agent has to be provided through etch holes within one or more layers that is/are adjacent to the sacrificial layer so that the etching agent can reach the sacrificial layer.

In operation, this cavity within, for example, a MEMS microphone can be used as a volume in which air is able to expand. In many cases, the openings of such cavities are relatively small compared to their respective depths. This case is called high aspect ratio.

SUMMARY OF THE INVENTION

An embodiment of the invention provides a method for manufacturing a MEMS device. The method comprises providing a cavity within a layer adjacent to a sacrificial layer. The cavity extends to the sacrificial layer and comprising a capillary slot protruding into the layer. The sacrificial layer is removed by exposing the sacrificial layer to an etching agent that is introduced through the cavity.

A further embodiment of the invention provides a method for manufacturing a MEMS device. The method comprises providing a capillary slot within a sidewall of a cavity and introducing an etching agent into the cavity for etching a bottom of the cavity.

A further embodiment provides a MEMS device comprising a cavity and a capillary slot extending outwards from the cavity.

BRIEF DESCRIPTION OF THE DRAWINGS

Embodiments of the present invention are described in the following with respect to the figures.

FIGS. 4a-4c show schematic layout examples of cavities having perimeters structured with a plurality of capillary slots;

FIGS. 5a-5c show further schematic layout examples of cavities having perimeters structured with a plurality of capillary slots;

FIGS. 6a-6d show schematic layout examples of cavities having extended hole perimeters; and FIG. 7 shows a schematic layout example of a cavity having a perimeter structured with a plurality of capillary slots being arranged in an unsymmetrical slot arrangement.

Figure 1A:
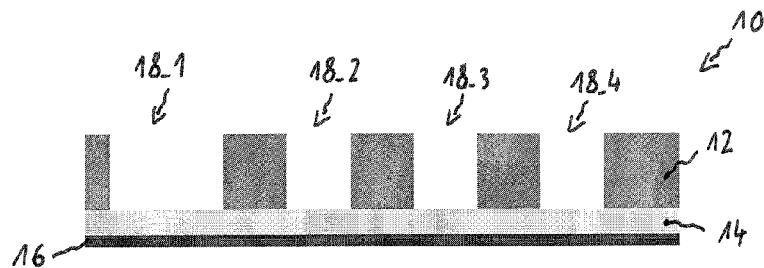
FIG. 1a schematically shows a MEMS device comprising cavities.

Different embodiments of the teachings disclosed herein will subsequently be discussed referring to FIGS. 1a to 7. In the drawings, identical reference numerals are provided to objects having identical or similar functions so that objects referred to by identical reference numerals within the different embodiments are interchangeable and the description is mutually applicable.

DETAILED DESCRIPTION OF ILLUSTRATIVE EMBODIMENTS

Figure 1B:
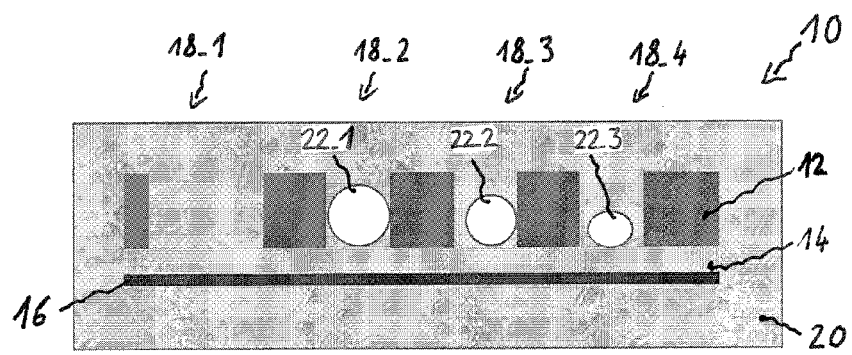
FIG. 1b schematically shows the MEMS device of FIG. 1a in a process of etching.
Figure 1C:
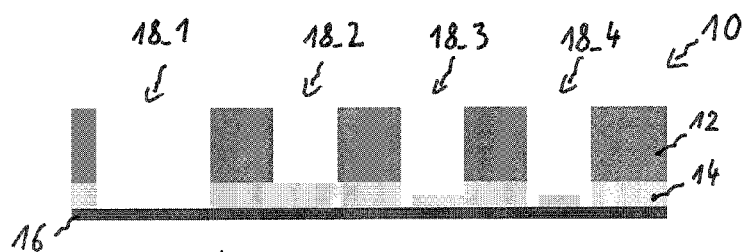
FIG. 1c schematically shows the MEMS device after the etching process has been finished.

Referring to FIGS. 1a to 1c, a process of wetting cavities in a MEMS device 10 is shown. In particular, in MEMS processes with bulk micro-machined deep cavities, such as in silicon microphones or speakers. Those cavities can be filled with an etching agent to perform sacrificial layer etching, for example.

In sacrificial layer etching, bubbles may remain inside cavities having high aspect ratio. These bubbles however have the potential to clog the introduction of etching agent to portions inside the cavity. This may hinder subsequent etching steps. For example, a sacrificial layer disposed on the bottom of the cavity cannot be reached by the etching agent since a bubble hinders the transfer. As a result, after application of the etching agent, parts of the sacrificial layer which are clogged by the bubble remain unetched, possibly resulting in a non-perfect wetting. Hence, undesired residuals of the sacrificial layer may remain on the bottom of the cavity.

FIG. 1a shows a MEMS device 10 comprising a layer 12. A sacrificial layer 14 is adjacent to a surface of the layer 12. The sacrificial layer 14 can be adjacent to the layer 12 directly or having at least one intermediate layer interposed. For example, the layer 12 may have been deposited on the sacrificial layer 14, or vice versa. A cover layer 16 can be adjacent to the sacrificial layer 14 such that the sacrificial layer 14 is sandwiched between the layer 12 and the cover layer 16.

Four cavities 18_1 to 18_4 may be provided within the layer 12. Each of these cavities 18_1 to 18_4 may extend from the surface opposing the cover layer 16 in the direction to the sacrificial layer 14. The number of four cavities is an example, only. A single cavity is also possible. Two or more cavities may also be possible.

FIG. 1b shows a step of wetting the MEMS device 10 described above. This step of wetting the MEMS device 10 can be performed by immersing the MEMS device 10 into an etching agent 20, as schematically shown in FIG. 1b. By immersing the MEMS device 10 into the etching agent 20, the cavities 18_1 to 18_4 may be completely or partially filled with the etching agent 20. In doing so, the etching agent 20 is introduced through the cavities 18_1 to 18_4 and should reach the sacrificial layer 14 to remove the whole sacrificial layer 14 or predetermined parts of this layer.

However, bubbles 22_1 to 22_3 tend to be created inside some of the cavities, especially in cases of cavities having high aspect ratio. As shown in FIG. 1b, three bubbles 22_1 to 22_3 are formed inside cavities 18_2 to 18_4 having higher aspect ratio as compared to cavity 18_1. These bubbles 22_1 to 22_3 tend to remain inside the cavities 18_2 to 18_4 due to the reduced opening of these cavities with respect to their depth, i.e., high aspect ratio.

Regarding respective cavities 18_2 to 18_4, the bubbles 22_1 to 22_3 typically do not escape even if the MEMS device 10 is completely immersed inside the etching agent 20 liquid. Note, that the smaller the diameter of the cavity is (at constant depth), the higher is the possibility that a bubble is created inside this cavity and will remain in this cavity. The same applies to the depth of a cavity. In other words, the higher the depth of a cavity is, the higher is the possibility that a bubble is created inside this cavity and will remain in this cavity. Otherwise, as schematically shown in FIG. 1b, the cavity 18_1 having a large diameter as compared to the remaining cavities 18_2 to 18_4, is free of a bubble.

Due to the bubbles remaining inside the cavities, the introduction of the etching agent 20 in the direction to the sacrificial layer 14 is clogged fully or in part. This results in that, compared to an unclogged cavity, less etching agent 20 arrives to the sacrificial layer 14 intended to be etched. Referring to FIG. 1c, if a cavity of the MEMS device 10 is clogged entirely, the underlying sacrificial layer 14 might remain completely unetched (refer to cavity 18_2). If a cavity of the MEMS device 10 is clogged in part by a bubble, only parts of the sacrificial layer 14 might be removed by etching (refer to cavities 18_3 and 18_4). However, if a cavity of the MEMS device 10 is free of a bubble, the sacrificial layer 14, which underlies this cavity, typically would be removed by etching completely, as originally intended (refer to cavity 18_1).

The results of etching based on the three cases as mentioned above are shown in FIG. 1c. In FIG. 1c, the part of the sacrificial layer 14 underlying the cavity 18_2 remains completely unetched. The reason for this is that the bubble 22_1 (refer to FIG. 1b) has clogged this cavity 18_2 substantially completely. In other words, in the course of etching, the space between the bubble 22_1 and the sacrificial layer 14 does not receive any etching agent 20.

However, in cavities 18_3 and 18_4, respective underlying parts of the sacrificial layer 14 have been etched in part. For example, in cavities 18_3 and 18_4 the sacrificial layer has been removed in those parts of the sacrificial layer in which, during etching, a gap is maintained between the surface of the bubble and the inner perimeter of the respective cavity. Summarized, the result of the etching process in cavities 18_2 to 18_4 may be unsatisfactory. In recent years, in MEMS technology, rising efforts in minimization of MEMS devices have been conducted. Hence, the problem of unsatisfactory wetting of cavities may arise more frequently.

Figure 2:
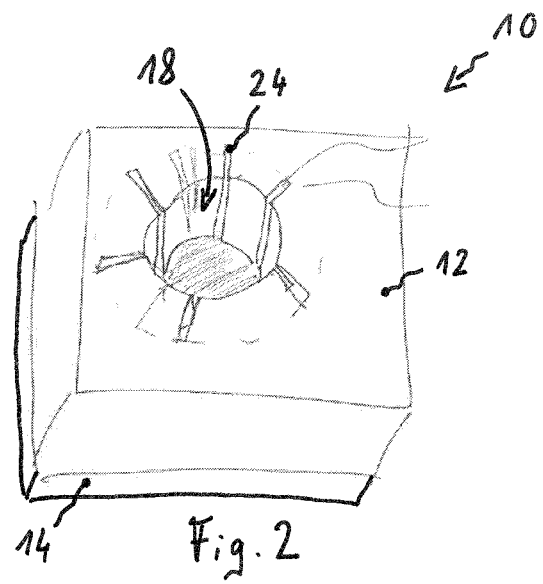
FIG. 2 shows a schematic perspective view of a MEMS device comprising a cavity having a perimeter structured with a plurality of capillary slots protruding into the layer of the MEMS device.

FIG. 2 is a schematic view of a MEMS device 10 comprising a layer 12 provided with a cavity 18. The bottom of the layer 12 is provided with a sacrificial layer 14. Those parts of the sacrificial layer 14 encircled by the perimeter of the cavity 18 are intended to be removed by etching. In other words, the sacrificial layer 14 should be removed by exposing the sacrificial layer 14 to an etching agent that is introduced through the cavity 18.

The perimeter of the cavity 18 is provided with a plurality of capillary slots 24. The capillary slots 24 protrude into the layer 12. The capillary slots 24 may be structured to substantially prevent bubbles remaining inside the cavity 18 during the step of removing the sacrificial layer 14. In other words, the plurality of capillary slots 24 can assist in enhanced wetting of the cavity 18 compared to the cavities shown in FIGS. 1a to 1c, for example.

The reason for this benefit is that, in wetting of the cavity 18, the capillary slots 24 may be adapted to create a capillary force on the liquid, for example, the etching agent, at the surface, which capillary force in turn results in a force pulling the liquid inside the cavity 18. This may results in wetting the perimeter as well as the bottom of the cavity 18 substantially entirely. By this effect, introduction of the etching agent into the cavity 18 can be accelerated, typically resulting in the effect that few or no bubbles are formed. In fact, the resulting capillary force may balance the surface tension of the bubble.

Summarized, even if the cavity 18 may be deep and/or has a small diameter, the provision of the plurality of capillary slots 24 can eliminate formation of bubbles. This results in the effect, that the introduction of etching agent in a direction to the bottom of the cavity 18, i.e., to the sacrificial layer 14, might not suffer from occlusion by at least one bubble.

The perimeter of the cavity can be structured such that the capillary slots 24 protrude substantially radially into the layer 12. As an alternative, the capillary slots 24 may protrude at an angle to the radial direction into the layer 12, or in a helical manner or a spiral manner. The capillary slots 24 can be arranged across the entire perimeter or at least a portion of the perimeter of the cavity 18. The capillary slots 24 may be spaced apart uniformly or non-uniformly. While not shown, a cover layer can be provided adjacent to an opposite side of the sacrificial layer 14 than the layer 12. Further, at least a portion of the cover layer may be transformed to a MEMS specific structure.

The capillary slots 24 shown in FIG. 2 may extend in the direction to the bottom of the cavity 18, i.e., to the surface of the sacrificial layer 14. While not shown, the perimeter of the cavity 18 can be structured with capillary slots arranged to extend over an entire extension or a portion of the extension orthogonal to an interface between the layer and the sacrificial layer.

In cross-section of the plane of the layer 12, the capillary slots 24 can be structured to have a rectangular shape. However, in cross-section of the plane of the layer 12, the capillary slots 24 can be structured to have a shape comprising a triangular shape, tapered shape, arc shape, circular shape, semicircular shape, elliptical shape and semi-elliptical shape or any combination thereof. Further, in cross-section of the plane of the layer 12, the capillary slots 24 can be very tiny without effecting the capillary force. Hence, the provision of the capillary slots 24 does not change the cavity dimensions, significantly.

The perimeter of the cavity 18 can be structured so that the capillary slots 24 assume a shape substantially uniform over the entire extension or a portion of the extension orthogonal to the plane of the layer 12, i.e., along the depth direction of the cavity 18. While not shown, the slots 24 can be structured to assume a shape across the entire extension normal to the plane of the layer 12 substantially tapered in a direction toward the sacrificial layer 14. In particular, the capillary slot(s) 24 may be relatively wide at the opening of the cavity 18 and become narrower towards the sacrificial layer 14.

Figure 3:
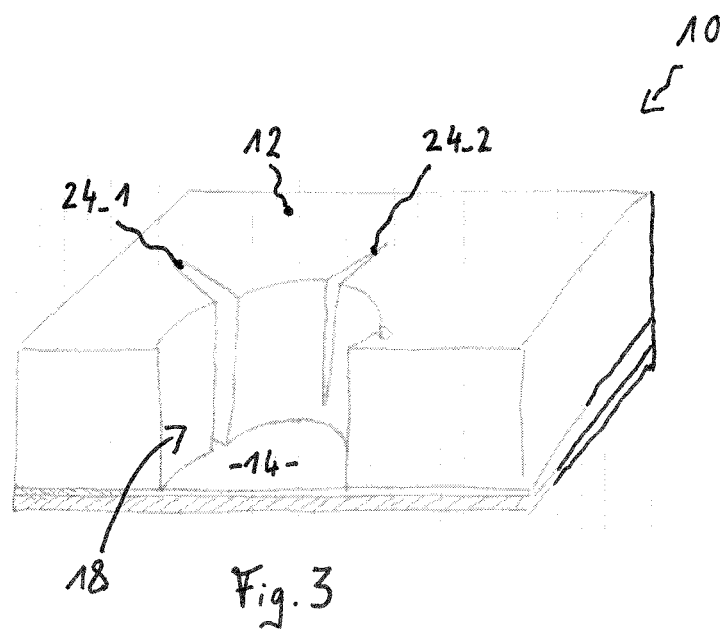
FIG. 3 shows a schematic cross-sectional view of a MEMS device comprising a cavity having a perimeter structured with a plurality of capillary slots protruding into the layer of the MEMS device.

FIG. 3 shows a cross-sectional view across the cavity 18 of a MEMS device 10. The perimeter (or sidewall) of the cavity 18 can be provided with a plurality of capillary slots 24 structured to protrude into the layer 12. By way of example, a capillary slot 24_1 can be arranged to protrude into the layer 12 substantially radially with respect to the cavity 18 or a center axis thereof. Further, the capillary slot 24_1 can be arranged to extend over the entire extension orthogonal to the plane of the layer 12. In other words, the capillary slot 24_1 may extend from the surface of the layer 12 to the sacrificial layer 14 provided on the opposite surface of the layer 12. Further, the perimeter of the cavity 18 can be structured that the capillary slot 24_1 assumes a triangular shape in cross-section of a plane parallel to an interface between the layer 12 and the sacrificial layer 14, substantially.

By way of example, FIG. 3 shows a further capillary slot 24_2 protruding into the layer 12 substantially radially. The perimeter of the cavity 18 can be structured that the capillary slot 24_2 assumes a shape over the entire extension normal to the plane of the layer 12 substantially tapered in a direction towards the sacrificial layer 14. Structuring the perimeter of the cavity 18 with capillary slots provided to assume a shape over the extension normal to the plane of the layer 12 that is tapered towards the sacrificial layer 14 can result in the benefit that the support region of the MEMS device 10 may remain substantially unchanged (support region: e.g., the interface between the layer 12 and the remaining sacrificial material after the sacrificial layer has been etched at the bottom of the cavity 18). Hence, providing the slots to have a tapered form does not necessarily result in reduced structural reliability of the MEMS device 10.

Summarized, while maintaining the dimensions of the cavities significantly unchanged, formation of bubbles can be substantially eliminated. This results in the effect that the MEMS device 10 can be wetted by introduction of a liquid, for example, an etching agent, even during a short time interval. The wetting of the cavity 18 may be enhanced by capillary force applied to the liquid due to the capillary slots provided across the entire perimeter or at least a portion of the perimeter of the cavity 18, wherein the capillary slots may be provided such to protrude into the layer 12. The capillary slots may be structured to substantially prevent bubbles remaining inside the cavity during the step of removing the sacrificial layer.

FIGS. 4a to 4c show schematic layout examples of cavities 18 having perimeters (or sidewalls) provided with different numbers of capillary slots 24. Each of the cavities 18 has a substantially circular perimeter (except for the presence of the capillary slots 24).

In FIG. 4a, the perimeter of the cavity 18 may be provided with four capillary slots 24 structured to protrude into a surrounding layer (not shown). The capillary slots 24 may be provided to have a triangular shape. The capillary slots 24 protrude into the layer substantially radially and are spaced apart from each other uniformly.

FIG. 4b shows a schematic layout example of a cavity 18 comprising a perimeter structured with a higher number of capillary slots 24 as compared to the example depicted in FIG. 4a. The capillary slots 24 may protrude into the layer (not shown) substantially radially. Compared to the capillary slots shown in FIG. 4a, the capillary slots 24 may protrude into the layer across a deeper radial distance. Further, in cross-section of the plane of the drawing page, the capillary slots 24 may be arranged to have a triangular shape.

FIG. 4c shows a schematic layout example of a cavity 18 comprising a perimeter structured with a higher number of capillary slots 24 as compared to the examples depicted in FIGS. 4a and 4b. The capillary slots 24 may be provided to have a reduced cross-section. Hence, the cavity dimension is not changed significantly. Note that the larger the number of capillary slots 24 (which are provided across the perimeter of the cavity 18) is, the larger may possibly be the capillary force applied to the liquid, for example, an etching agent, at the surface. This may result in a force, pulling the liquid inside the cavity 18 and wetting the perimeter and the bottom of the cavity 18 entirely. By this effect, the filling of the cavity 18 might be accelerated, which might reduce or eliminate the formation of bubbles.

FIGS. 5a to 5c show layout examples of cavities 18 comprising perimeters having different numbers of capillary slots. Each of the cavities 18 has a substantially circular form.

FIG. 5a shows a cavity 18 comprising a perimeter structured to comprise four capillary slots 24 provided to protrude into the layer (not shown). The capillary slots 24 may be provided to have a semi-circular shape in a cross-section of the drawing page. The capillary slots 24 may protrude radially into the layer and may be spaced apart from each other substantially uniformly.

FIG. 5b shows a cavity 18 comprising a perimeter structured to comprise a higher number of capillary slots 24 as compared to the example shown in FIG. 5a. The capillary slots 24 may be provided to have a substantially rectangular body shape, finished by a distal end having a semi-circular shape. While not shown, different shapes of the capillary slots 24 in cross-section of the drawing page are conceivable, comprising at least one of a triangular shape, arc shape, rectangular shape, tapered shape, circular shape, semi-circular shape, elliptical shape and semi-elliptical shape or any combination thereof.

FIG. 5c shows a cavity having a perimeter structured to comprise a plurality of capillary slots 24 protruding into the layer (not shown). In this example, the capillary slots 24 may be formed by arranging semi-circular recesses in a side-by-side manner across the perimeter. In doing so, compared to the examples shown in FIGS. 5a and 5b, the number of capillary slots 24 may be increased. This in turn can provide increased generation of a capillary force on the liquid, for example, an etching agent, at the surface, resulting in a force, pulling the liquid inside the cavity 18 and wetting the whole perimeter as well as the bottom of the cavity 18, reliably. Therefore, the filling of the cavity 18 can be accelerated, giving less chance for the formation of bubbles. The resulting capillary force balances the surface tension of a respective bubble.

FIGS. 6a to 6d show layout examples of cavities 18 having perimeters structured to comprise a plurality of slots 24 having different slot geometries, respectively. Each of the cavities 18 may have a substantially circular perimeter.

FIG. 6a shows a cavity 18 having a perimeter structured with a plurality of capillary slots 24 protruding into a surrounding layer (not shown). The capillary slots 24 may have a rectangular shape in cross-section of the drawing page. Across the entire perimeter of the cavity 18, the capillary slots 24 are spaced apart from each other substantially uniformly or in a substantially equidistant manner. Further, the capillary slots 24 may extend into the layer radially. In this example, the perimeter of the cavity 18 may be extended in size. Therefore, the surface of a possibly enclosed bubble may be increased. While not shown, different shapes of the capillary slots 24 in cross-section are conceivable, comprising at least one of a triangular shape, arc shape, tapered shape, circular shape, semi-circular shape, elliptical shape and semi-elliptical shape or any combination thereof.

According to some embodiments, the cavity can be delimited by a sidewall having edges between zero degrees and 180 degrees, i.e., reentrant edges, but not salient edges. The edges may typically extend orthogonal to the plane of the layer 12 and/or the sacrificial layer 14, but could also extend oblique to said plane in alternative embodiments. Salient edges (i.e., having an angle greater than 180 degree) may typically be encountered at a transition from the cavity to a capillary slot. Referring to the example shown in FIG. 6a, an angle of approximately 270 degrees can be observed at each transition of the cavity sidewall to a sidewall of a capillary slot 24. The sidewalls of the capillary slots 24 itself are, in FIG. 6a, delimited by two edges (reentrant) defined by angles of approximately 90 degrees, respectively (in alternative embodiments, numbers of edges other than two and/or angles other than 90 degrees are also possible). Note that a circular or arched sidewall can be regarded as the limit case of a very high (or even infinite) number of edges having angles of substantially 180 degrees. According to alternative embodiments, the cavity 18 may correspond to the largest non-salient shape (in particular, in a cross section substantially parallel to layer(s) 12, 14, and/or to a main surface of the MEMS device) that can be inscribed into the total cavity, wherein the total cavity may be regarded as the union of the cavity 18 and the capillary slot(s) 24.

FIG. 6b shows a cavity 18 having a perimeter structured with a plurality of capillary slots 24. The capillary slots 24 may be provided to have a tapered shape in cross-section of the drawing page. The capillary slots 24 are arranged across the perimeter in a side-by-side manner. Also in this example, the perimeter of the cavity 18 is extended in size to increase the surface of a possibly enclosed bubble. Therefore, the possibility of the formation of a bubble inside the cavity 18 can be reduced. While not shown, different shapes of the capillary slots 24 in cross-section are conceivable, further comprising at least one of a triangular shape, arc shape, rectangular shape, circular shape, semi-circular shape, elliptical shape and semi-elliptical shape or any combination thereof.

FIG. 6c shows another example of a cavity 18 having a perimeter structured with a plurality of slots 24 protruding into a layer (not shown) radially. Unlike the examples shown in FIGS. 6a and 6b, the capillary slots 24 may be provided to have a triangular shape in cross-section of the drawing page. The triangular shaped capillary slots 24 may be arranged across the perimeter in a side-by-side manner. This arrangement can provide increased size of the perimeter. The extension in size of the perimeter may in turn increase the surface of a possibly enclosed bubble. Therefore, the possibility of the formation of a bubble inside the cavity 18 is reduced. While not shown, different shapes of the capillary slots 24 in cross-section are conceivable, further comprising at least one of a rectangular shape, tapered shape, arc shape, circular shape, semi-circular shape, elliptical shape and semi-elliptical shape or any combination thereof.

FIG. 6d shows a cavity 18 having a perimeter structured with a plurality of capillary slots 24 protruding into a surrounding layer (not shown). In this example, the capillary slots 24 may be structured to have a semi-circular shape. Similar to the examples shown in FIGS. 6a to 6c, the capillary slots 24 may be arranged in a side-by-side manner. In the exemplary cavity 18 as shown in FIG. 6d, the size of the perimeter of the cavity 18 may be extended, which extended size may increase the surface of a possibly enclosed bubble. Therefore, the possibility of the formation of a bubble inside the cavity 18 can be reduced. While not shown, different shapes of the capillary slots 24 in cross-section are conceivable, further comprising at least one of a triangular shape, arc shape, rectangular shape, tapered shape, elliptical shape and semi-elliptical shape or any combination thereof.

FIG. 7 shows a layout example of a cavity 18 having a perimeter structured with a plurality of capillary slots 24 protruding into a surrounding layer (not shown). The plurality of capillary slots 24 may be provided to have a triangular shape in cross-section of the drawing page. In contrast to the examples shown in FIGS. 6a to 6d, the capillary slots 24 can be arranged across a portion of the perimeter (i.e., single segment of the perimeter) of the cavity 18, solely, which portion can be composed of a semi-circle. This arrangement differs from those depicted in FIGS. 6a to 6d, in which arrangements the capillary slots may be arranged across the entire perimeter of each of the cavities.

In the course of the introduction of liquid into the cavity 18, the unsymmetrical slot arrangement as shown in FIG. 7 may be adapted to push possibly introduced bubbles out to one side of the perimeter of the cavity 18. A possibly introduced bubble could be pushed out along a helical path, as depicted by an arrow. Other paths may be conceivable. While not shown, other unsymmetrical slot arrangements are possible. For example, the slots 24 may be arranged across a portion of the perimeter composed of a quadrant, etc. While not shown, different shapes of the capillary slots 24 in cross-section are conceivable, comprising at least one of a rectangular shape, tapered shape, arc shape, circular shape, semi-circular shape, elliptical shape and semi-elliptical shape or any combination thereof.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method steps may be executed by such an apparatus.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

What is claimed is:

1. A method for manufacturing a MEMS device, the method comprising:
   providing a cavity within a layer adjacent to a sacrificial layer, the cavity extending to the sacrificial layer and comprising a capillary slot protruding into the layer; and
   removing the sacrificial layer by exposing the sacrificial layer to an etching agent that is introduced through the cavity.

2. The method according to claim 1, further comprising structuring the capillary slot to substantially prevent bubbles remaining inside the cavity during the step of removing the sacrificial layer.

3. The method according to claim 1, further comprising structuring a perimeter of the cavity that the capillary slot assumes a shape in cross-section of a plane parallel to an interface between the layer and the sacrificial layer comprising at least one of a triangular shape, rectangular shape, tapered shape, arc shape, circular shape, semi-circular shape, elliptical shape, and semi-elliptical shape.

4. The method according to claim 1, further comprising structuring a perimeter of the cavity that the capillary slot has a substantially uniform cross section over an entire extension or a portion of the extension orthogonal to an interface between the layer and the sacrificial layer.

5. The method according to claim 1, further comprising structuring a perimeter of the cavity that the capillary slot has a cross section over an entire extension or a portion of the extension orthogonal to an interface between the layer and the sacrificial layer, said cross section being substantially tapered in a direction towards the sacrificial layer.

6. The method according to claim 1, further comprising: structuring a perimeter of the cavity that, across the entire perimeter or at least a portion of the perimeter of the cavity, a plurality of capillary slots are spaced apart uniformly or non-uniformly.

7. The method according to claim 1, wherein a perimeter of the cavity is structured such that the capillary slot protrudes substantially radially into the layer.

8. The method according to claim 1, further comprising:
providing a cover layer adjacent to an opposite side of the sacrificial layer than the layer; and
transforming at least a portion of the cover layer to a MEMS specific structure.

9. A method for manufacturing a MEMS device, the method comprising:
providing a capillary slot within a sidewall of a cavity; and
introducing an etching agent into the cavity for etching a bottom of the cavity.

10. A MEMS device comprising:
a cavity; and
a capillary slot extending outwards from the cavity, wherein the cavity and the capillary slot are comprised in the MEMS device.

11. The MEMS device according to claim 10, wherein the capillary slot has a shape in cross-section comprising at least one of a triangular shape, rectangular shape, tapered shape, arc shape, circular shape, semi-circular shape, elliptical shape, and semi-elliptical shape.

12. The MEMS device according to claim 10, wherein the capillary slot has a substantially uniform cross section over an entire extension of the cavity.

13. The MEMS device according to claim 10, wherein the capillary slot has a cross section over an entire extension or a portion of the extension of the cavity substantially tapered in a direction towards the bottom of the cavity.

14. The MEMS device according to claim 10, wherein, across an entire perimeter or at least a portion of the perimeter of the cavity, a plurality of capillary slots are spaced apart uniformly or non-uniformly.

15. The MEMS device according to claim 10, wherein the capillary slot is shaped to substantially prevent bubbles remaining inside the cavity during an etching process.

16. The MEMS device according to claim 10, wherein the capillary slot protrudes substantially radially outwards from the cavity.

17. The MEMS device according to claim 10, further comprising a MEMS specific structure adjacent to the cavity.

18. The MEMS device according to claim 10, wherein the MEMS device is a MEMS microphone, a MEMS speaker, or a MEMS pressure sensor.

19. The MEMS device according to claim 10, wherein the capillary slot extends from a circumferential portion of the cavity having a length between about 0.1% and about 10% of a total circumferential length of the cavity.

20. The MEMS device according to claim 10, wherein the cavity has a non-salient cross section parallel to a main surface of the MEMS device.

21. The MEMS device according to claim 10, wherein the cavity is delimited by a sidewall having reentrant edges only.

\* \* \* \* \*